(12) United States Patent
Suzuki et al.

(10) Patent No.: US 8,624,301 B2
(45) Date of Patent: Jan. 7, 2014

(54) BACK-ILLUMINATED SOLID-STATE IMAGE PICKUP DEVICE

(75) Inventors: Hisanori Suzuki, Hamamatsu (JP);
Yasuhito Yoneta, Hamamatsu (JP);
Masaharu Muramatsu, Hamamatsu (JP); Koei Yamamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 38 days.

(21) Appl. No.: 13/258,696

(22) PCT Filed: Mar. 23, 2010

(86) PCT No.: PCT/JP2010/055004
§ 371 (c)(1),
(2), (4) Date: Oct. 20, 2011

(87) PCT Pub. No.: WO2010/110275
PCT Pub. Date: Sep. 30, 2010

(65) Prior Publication Data
US 2012/0256287 A1    Oct. 11, 2012

(30) Foreign Application Priority Data
Mar. 27, 2009 (JP) ............................... P2009-079563

(51) Int. Cl.
*H01L 27/148* (2006.01)
(52) U.S. Cl.
USPC .................................. 257/228; 257/E27.152
(58) Field of Classification Search
USPC .................... 257/228, 460, E27.152
See application file for complete search history.

(56) References Cited

U.S. PATENT DOCUMENTS

| | | | |
|---|---|---|---|
| 5,760,431 A | 6/1998 | Savoye et al. | |
| 6,806,904 B1 | 10/2004 | Kim | |
| 2006/0237625 A1 | 10/2006 | Caupain et al. | |
| 2012/0256287 A1* | 10/2012 | Suzuki et al. | 257/460 |

FOREIGN PATENT DOCUMENTS

| | | |
|---|---|---|
| EP | 1 220 319 | 7/2002 |
| FR | 2 857 160 | 1/2005 |
| JP | H2-168669 | 6/1990 |
| JP | 2001-57418 | 2/2001 |
| JP | 2002-231925 | 8/2002 |
| JP | 2003-78826 | 3/2003 |
| JP | 2004-241653 | 8/2004 |
| WO | WO 97/20351 | 6/1997 |

OTHER PUBLICATIONS

"Etaloning in Back-Illuminated CCDs," Roper Scientific Technical Note, issued by Roper Scientific, 2000.

* cited by examiner

*Primary Examiner* — Mark Prenty
(74) *Attorney, Agent, or Firm* — Drinker Biddle & Reath LLP

(57) ABSTRACT

In a back-illuminated solid-state image pickup device including a semiconductor substrate 4 having a light incident surface at a back surface side and a plurality of charge transfer electrodes 2 disposed at a light detection surface at an opposite side of the semiconductor substrate 4 with respect to the light incident surface, a plurality of openings OP for transmitting light are formed between charge transfer electrodes 2 that are adjacent to each other. Also, a plurality of openings OP for transmitting light may be formed inside each charge transfer electrode 2.

3 Claims, 13 Drawing Sheets

BACK-ILLUMINATED SOLID-STATE IMAGE PICKUP DEVICE

TECHNICAL FIELD

The present invention relates to a back-illuminated solid-state image pickup device.

BACKGROUND ART

A BT (back-illuminated thinning)-CCD is known as a back-illuminated solid-state image pickup device with which a light incident surface side of a substrate is thinned. According to Non-Patent Literature 1, interference (etaloning) occurs between light to be detected made incident on the BT-CCD and light resulting from the incident light to be detected reflecting from a detection side surface of the BT-CCD, thereby affecting detection characteristics in a near-infrared range. In the literature, to suppress the etaloning, a photosensitive region is increased in thickness and further, an anti-reflection film is provided on the photosensitive region.

CITATION LIST

Non Patent Literature

Non-Patent Literature 1: "Etaloning in Back-Illuminated CCDs," Roper Scientific Technical Note, issued by Roper Scientific, 2000, No. 7.

SUMMARY OF INVENTION

Technical Problem

However, the conventional solution method for BT-CCD sacrifices an intrinsic merit of BT-CCD, which is an improvement of detection sensitivity by thinning, and has not led to essential improvement of image quality.

The present invention has been made in view of this issue and an object thereof is to provide a back-illuminated solid-state image pickup device capable of being improved in image quality by suppression of image degradation due to etaloning.

Solution to Problem

To resolve the above issue, a back-illuminated solid-state image pickup device according to the present invention includes a semiconductor substrate having a light incident surface at a back surface side and a plurality of charge transfer electrodes disposed at a light detection surface at an opposite side of the semiconductor substrate with respect to the light incident surface and has a plurality of openings for transmitting light formed between charge transfer electrodes that are adjacent to each other.

Although light incident on the back surface is detected at the light detection surface side, with the solid-state image pickup device according to the present invention, a portion of the light that is normally subject to light detection is transmitted to an exterior via the openings. At the openings, reflection is suppressed because the charge transfer electrodes are not present and interference of the incident light and the reflected light is suppressed. Image degradation due to etaloning is thus suppressed and image quality is improved.

Also, preferably, the openings are positioned so as to be aligned along a charge transfer direction. In a case where the openings formed between adjacent charge transfer electrodes are aligned in this manner, reflected light is suppressed despite the simplicity of the arrangement. However, with this structure, alignment precision is required during manufacture of the charge transfer electrodes, and there is thus room for further improvement in that in a case where the alignment precision is low, areas of the openings at the pixels differ according to each column and characteristics vary according to pixel, etc.

Thus, preferably, the openings are positioned staggeredly along the charge transfer direction. That is, the openings are positioned in a mutually staggered manner. In a case of employing such a staggered opening layout, if the charge transfer electrodes of odd rows (p+1-th rows and p+3-th rows (where p is an integer no less than 0)) are formed at the same time, the charge transfer electrodes of even rows (p+2-th rows and p+4-th rows) are formed at the same time in a separate step, and the charge transfer electrodes of the even rows are shifted laterally during manufacture so that the areas of the openings between the charge transfer electrodes of a p+1-th row and a p+2-th row increase, the areas of the openings between the charge transfer electrodes of a p+3-th row and a p+4-th row decrease. That is, with this structure, an alignment precision tolerance is high, and transmitted light amount is equalized and characteristics are made uniform among respective pixels.

Also, preferably, in regard to shape and layout of the charge transfer electrodes, the charge transfer electrode of a p+1-th row has a first shape, the charge transfer electrode of a p+2-th row has a second shape, the charge transfer electrode of a p+3-th row has a third shape, the charge transfer electrode of a p+4-th row has a fourth shape, the first to fourth shapes all differ from each other, openings of a first pattern are formed between the charge transfer electrodes of the p+1-th row and the p+2-th row, openings of a second pattern are formed between the charge transfer electrodes of the p+3-th row and the p+4-th row, and the first and second patterns are mutually different.

In the case of such a structure, the openings are high in randomness because the shapes of the charge transfer electrodes and the patterns of the openings differ and, for example, even in a case where the charge transfer electrodes of the p+2-th row and the p+4-th row are shifted in the lateral direction, variation of the opening area can be suppressed.

Also, a back-illuminated solid-state image pickup device according to the present invention includes a semiconductor substrate having a light incident surface at a back surface side and a plurality of charge transfer electrodes disposed at a light detection surface at an opposite side of the semiconductor substrate with respect to the light incident surface and has a plurality of openings for transmitting light formed inside the respective charge transfer electrodes.

Even with this structure, a portion of the light that is normally subject to light detection is transmitted to the exterior via the openings. At the openings, reflection is suppressed because the charge transfer electrodes are not present and interference of the incident light and the reflected light is suppressed. Image degradation due to etaloning is thus suppressed and image quality is improved.

Advantageous Effects of Invention

By the back-illuminated solid-state image pickup device according to the present invention, a high-quality image can be acquired.

DESCRIPTION OF EMBODIMENTS

A back-illuminated solid-state image pickup device 100 according to an embodiment shall now be described. Elements that are the same shall be provided with the same symbol and overlapping description shall be omitted.

Figure 1:
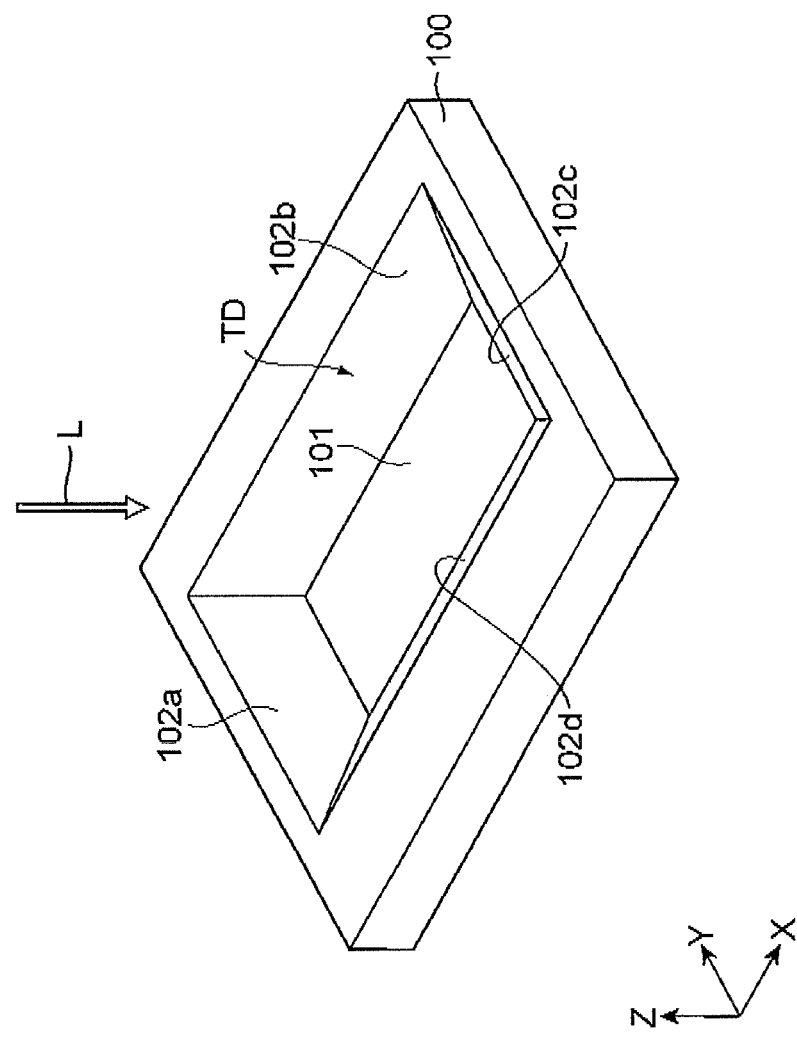
FIG. 1 is a perspective view of a back-illuminated solid-state image pickup device 100 according to an embodiment.

FIG. 1 is a perspective view of the back-illuminated solid-state image pickup device 100 according to the embodiment. For convenience of description, a three-dimensional orthogonal coordinate system made up of an X-axis, a Y-axis, and a Z-axis that are mutually orthogonal is shown in the figure.

The back-illuminated solid-state image pickup device 100 is a BT-CCD (charge coupled device) that has been thinned by etching a back surface side of a semiconductor substrate by an aqueous KOH solution, etc., a depressed portion TD is formed at a central region that has been etched, and a thick frame portion is present at a periphery of the depressed portion TD. Each of side surfaces 102a, 102b, 102c, and 102d of the depressed portion TD is inclined and forms an obtuse angle with respect to a bottom surface 101. The frame portion may be removed by etching to form a back-illuminated solid-state image pickup device that is thinned over its entire region.

The thinned central region of the semiconductor substrate is a photosensitive region (image pickup region) and an optical image L from an object is made incident on the photosensitive region along a negative direction of the Z-axis. The bottom surface 101 of the depressed portion TD of the semiconductor substrate makes up a light incident surface. A CCD for image pickup made up of a plurality of vertical shift registers is formed as pixels in the photosensitive region.

Figure 2:
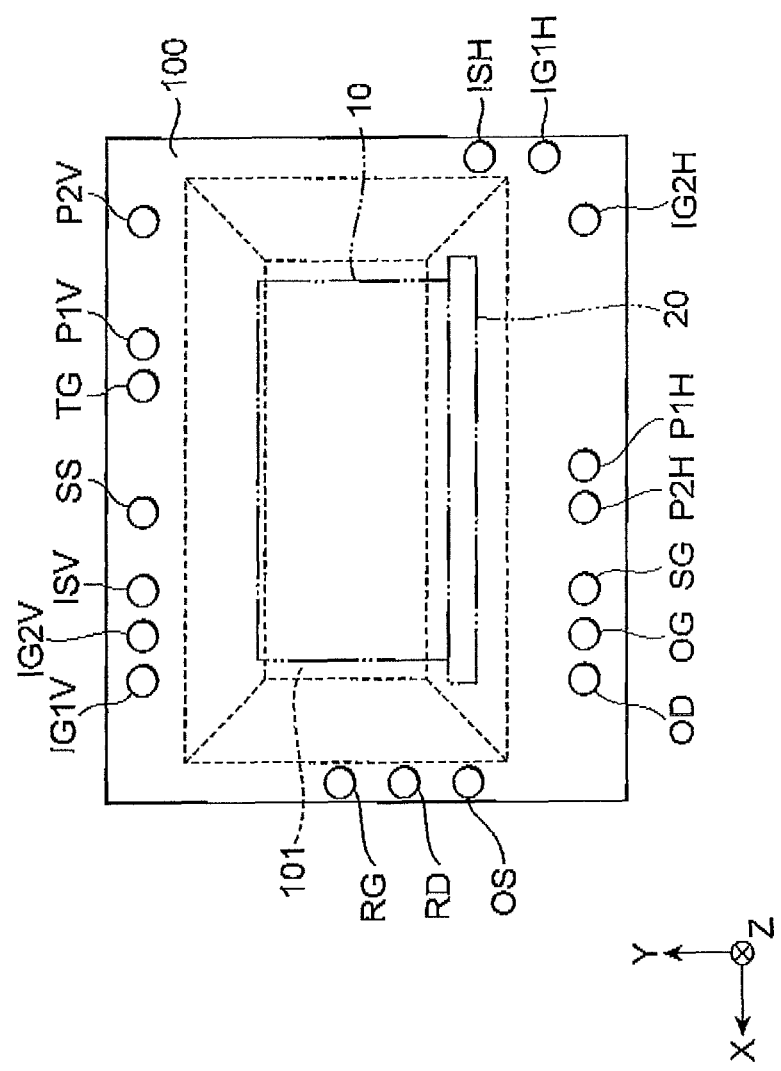
FIG. 2 is a bottom view of the back-illuminated solid-state image pickup device 100 as viewed from a side opposite to a light incident direction.

FIG. 2 is a bottom view of the back-illuminated solid-state image pickup device 100 as viewed from a side opposite to the light incident direction. The image pickup region 10 is formed in a region corresponding to the bottom surface 101 of the thinned semiconductor substrate. The optical image made incident on the image pickup region 10 is converted to a two-dimensional charge image and charges thereof are transferred along a negative direction of the Y-axis. A horizontal shift register 20 is disposed at a terminal in the charge transfer direction of the image pickup region 10, and the charges of the respective pixels that have been transferred in the vertical direction are successively transferred along the X-axis direction. A plurality of electrode pads are disposed at the frame portion of the back-illuminated solid-state image pickup device 100.

The main electrode pads are electrode pads P1V and P2V for applying a two-phase transfer voltage to the charge transfer electrodes, electrode pads P1H and P2H for applying a two-phase transfer voltage to the charge transfer electrodes, an electrode pad SS for connecting the semiconductor substrate to a ground, and electrode pads SG, OG, OD, RG, and RD for reading the charges transferred in the horizontal direction, and an output can be taken out from an electrode pad OS.

Other electrode pads may be provided as suited according to specifications, and the present embodiment includes an electrode pad TG for making a charge transfer gate to the horizontal shift register 20 function, electrode pads ISV and ISH for inputting test signals, and electrode pads 1G1V, 1G2V, 1G1H, and 1G2H for making charge transfer gates for the test signals function. As charge transfer types of a CCD, a frame transfer type, an interline transfer type, a full frame transfer type, etc., are known. Various such CCD structures are known and although there is no limitation in particular, a full frame transfer type CCD shall be described as an example.

Figure 3:
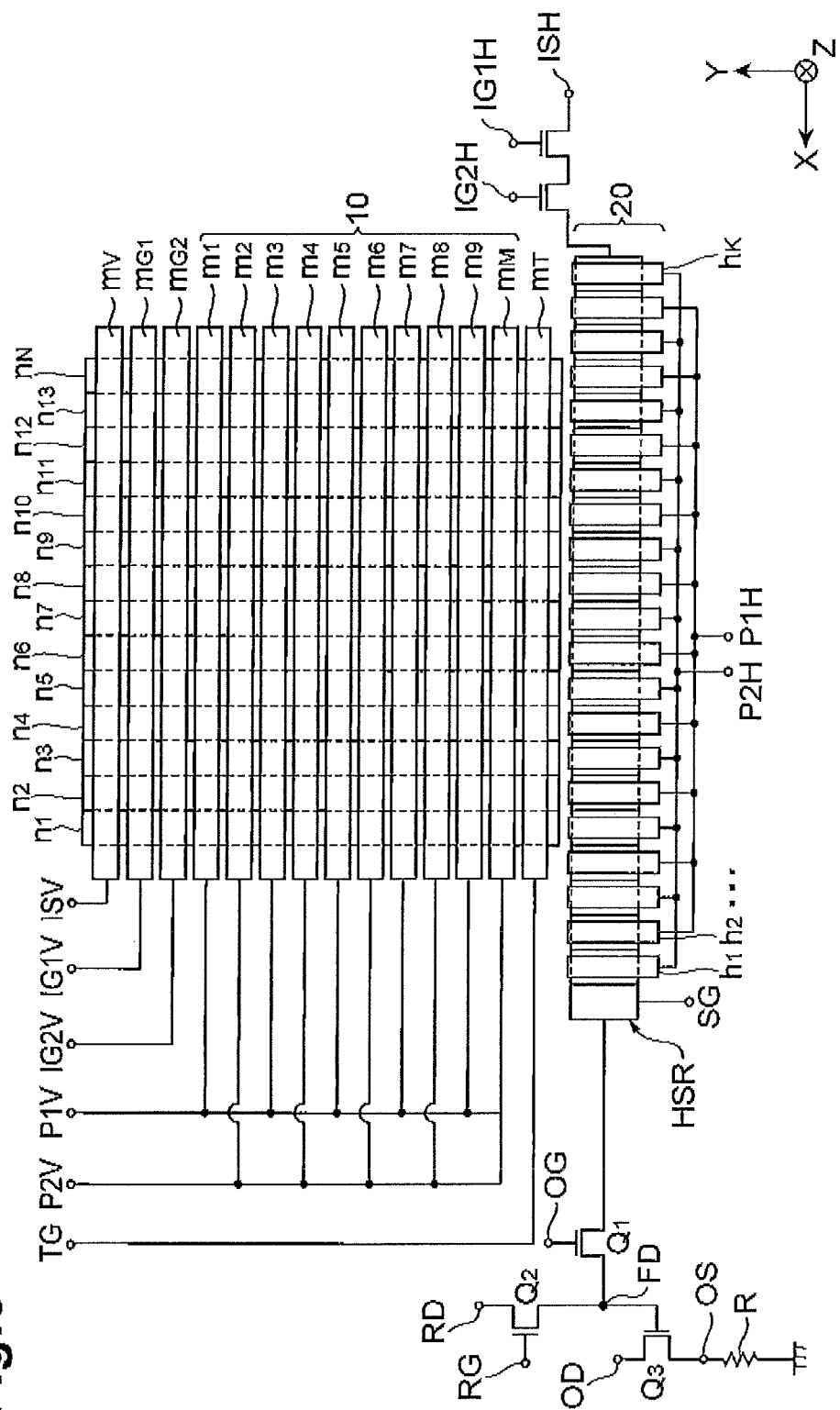
FIG. 3 is a diagram of an image pickup region 10 and a horizontal shift register 20 formed on a top surface side (opposite side with respect to a light incident surface (back surface)).

FIG. 3 is a diagram of the image pickup region 10 and the horizontal shift register 20 formed on a top surface side (opposite side with respect to the light incident surface (back surface)). This figure is a schematic figure and although the respective transfer electrodes extending in the X-axis direction are indicated as being rectangular in shape and as there being gaps present in between the electrodes, in actuality, a portion or all of the electrodes overlap and the shapes thereof are designed to have openings for transmitting light as shall be described later.

A plurality of vertical shift registers $n_1$ to $n_N$ (where N is an integer no less than 2), that is, a vertical charge transfer CCD is aligned in the image pickup region 10. The actual image pickup region is a central region of the image pickup region 10 and peripheral pixels are shielded from light as necessary. Vertical direction pixels are aligned along the Y-axis, and each of charge transfer electrodes $m_1$ to $m_M$ (where M is an integer no less than 2) extends along the X-axis. The two-phase transfer voltage from the electrode pads P1V and P2V is applied to the charge transfer electrodes $m_1$ to $m_M$ and charges accumulated in the semiconductor region directly below the charge transfer electrodes $m_1$ to $m_M$ are transferred in the vertical direction (Y-axis negative direction). Between vertical CCD channels (semiconductor charge transfer regions) making up the respective vertical shift registers $n_1$ to $n_N$ is formed an isolation region of a conductive type that is opposite that of the charges flowing through the CCD channels and the isolation regions suppress mutual mixing of charges from different pixel columns.

A transfer gate electrode $m_T$ is disposed at a final position of charge transfer in the vertical direction, and charges flow from the image pickup region 10 into the horizontal shift resistor 20 via the potential directly below the transfer gate electrode $m_T$ and in accordance with the voltage from the electrode pad TG. The horizontal shift register 20 is a horizontal charge transfer COD, which is aligned along the X-axis and transfers charges in the horizontal direction (X-axis positive direction) and has charge transfer electrodes $h_1$ to $h_K$ (where K is an integer no less than 2) disposed at a semiconductor charge transfer region HSR that extends in the X-axis direction, and these charge transfer electrodes are aligned along the X-axis direction.

The two phase transfer voltage from the electrode pads P1H and P2H is applied to the charge transfer electrodes $h_1$ to $h_K$ and charges accumulated in the semiconductor region directly below the charge transfer electrodes $h_1$ to $h_K$ are transferred in the horizontal direction (X-axis direction). A charge reading circuit is disposed at a final position of the X-axis charge transfer. The charge reading circuit includes a signal gate region positioned at a terminal of the horizontal shift register that is connected to the electrode pad SG. Next to the signal gate region, a floating diffusion region FD is disposed via a transistor $Q_1$ having a MOS-FET structure. The floating diffusion region FD is connected via a reset transistor $Q_2$ to the reset drain electrode pad RD and to a gate electrode of an output transistor $Q_3$. One terminal of the output transistor $Q_3$ is connected to the overflow drain electrode pad OD and the other terminal makes up the output terminal OS. A load resistor R is connected to the output terminal OS. The reset gate electrode pad RG is connected to a gate electrode of the transistor $Q_2$.

A suitable high-level potential is constantly applied to the electrode pads OG, OD, and RD. In a signal reading process, the electrode pad SG and the electrode pad RG are set to the high level, and after setting the potential of the floating diffusion region FD to the reset potential of the reset electrode pad RD, the electrode pad RG is set to the low level so that the output signal is set at the floating level. The electrode pad SG is then set to the low level so that the signal charges, which were temporarily accumulated in the signal gate region, flow into the floating diffusion region FD and the output signal taken out from the electrode pad OS is set at a signal level that is in accordance with an amount of the accumulated charge.

The rest of the arrangement is for performing a test operation, and the test operation is performed by inputting test signals from the electrode pads ISV and ISH and applying suitable potentials to the electrode pads IG1V, IG2V, IG1H, and IG2H. The electrode pad ISV is connected to an electrode $m_V$, which is electrically connected to the semiconductor substrate. The electrode pads IG1V and IG2V are connected to gate electrodes $m_{G1}$ and $m_{G2}$, disposed on the CCD channel via an insulating film. Suitable signals are input into these and if an output that differs from that of a normal case is obtained, the device is judged to be abnormal.

Figure 7:
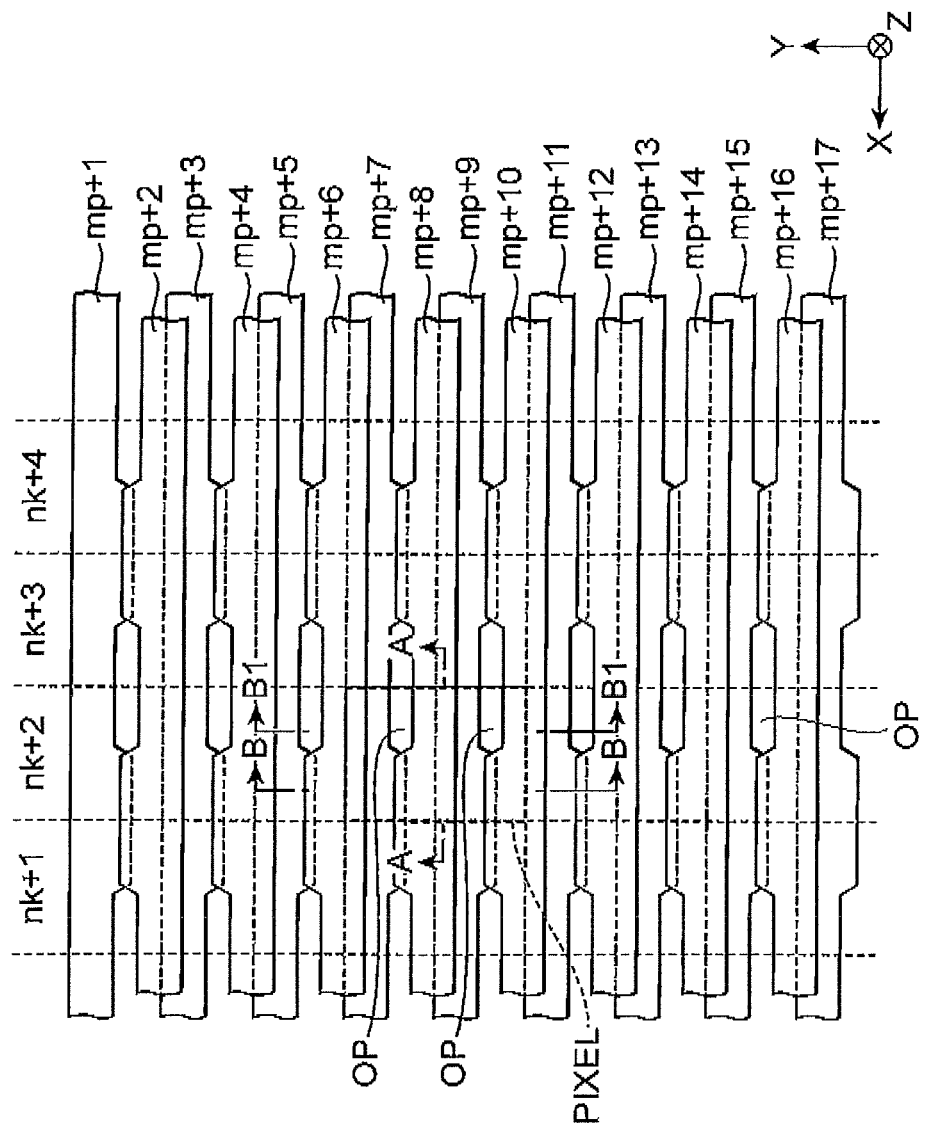
FIG. 7 is a plan view of an image pickup region for describing a structure of charge transfer electrodes 2 (mp+1 to mp+17 . . . ) of an embodiment.

Also, each pixel is made up of an intersection region of each of the CCD channels $n_N$ and several transfer electrodes $m_M$ shown in FIG. 3 (see the pixel PIXEL in FIG. 7).

Figure 4:
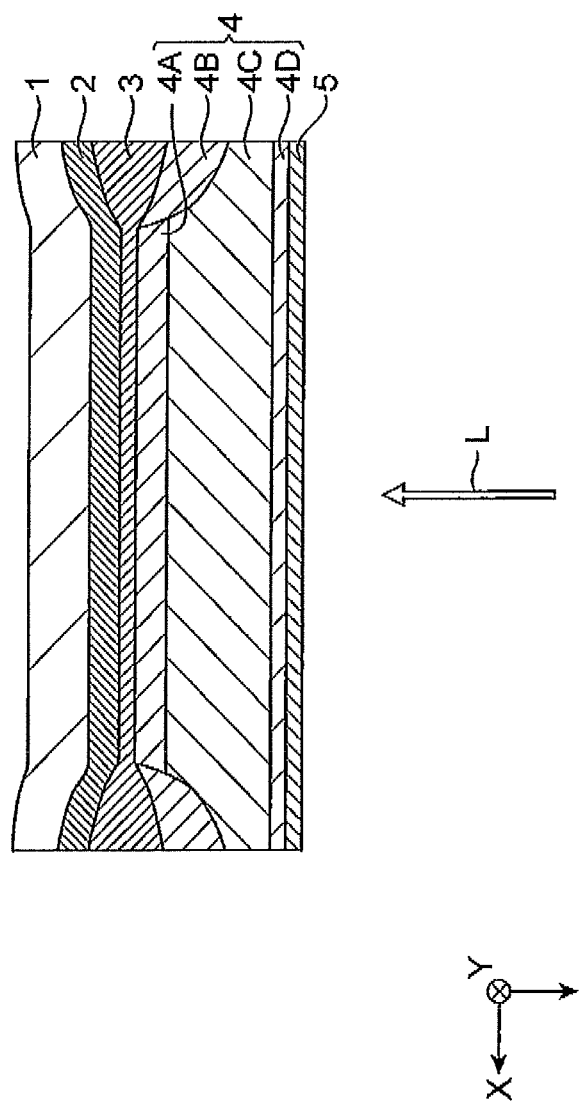
FIG. 4 is a longitudinal sectional view of a single pixel taken along an XZ plane.

FIG. 4 is a longitudinal sectional view of a single pixel taken along an XZ plane.

The incident light L enters from the back surface (light incident surface) of the semiconductor substrate. That is, the semiconductor substrate has the light incident surface. The pixel includes, in an order starting from the substrate top surface side, a protective film 1, charge transfer electrodes 2 (=respective charge transfer electrodes $m_1$ to $m_M$ shown in FIG. 3), an insulating layer 3, the semiconductor substrate 4 made of Si, and an antireflection film 5. The semiconductor substrate 4 includes a P-type semiconductor substrate 4C, an N-type semiconductor layer 4A formed on the P-type semiconductor substrate 4C, an accumulation layer 4D formed at a back surface side of the P-type semiconductor substrate 4C, and isolation regions 4B formed at both sides of the CCD channel. The P-type semiconductor substrate 4C and the N-type semiconductor layer 4A contact to form a PN junction, and a buried channel type CCD is thereby arranged. The N-type semiconductor layer 4A (PN junction) may be omitted and in this case, the CCD functions as a surface channel type CCD.

In the present example, the protective film 1 is formed of BPSG (boro-phospho silicate glass), the charge transfer electrode 2 is made of polysilicon, the insulating layer 3 is made of $SiO_2$, and both the isolation regions 4B and the accumulation layer 4D are made of Si added with a high concentration of a P-type impurity. The pixel functions even when the conductive types P and N of the semiconductors are interchanged. "High concentration" means that the impurity concentration is higher than the impurity concentration of the P-type semiconductor substrate 4C and is favorably a concentration of no less than $1 \times 19$ $cm^{-3}$.

A method for manufacturing the solid-state image pickup device with the above structure shall now be described.

First, as shown in FIG. 4, the P-type semiconductor substrate 4C is prepared. The semiconductor substrate 4C is thinned. Next, a mask is patterned and formed on regions corresponding to the pixels, the P-type impurity is added to the substrate top surface using an ion implantation method or diffusion method to form the isolation regions 4B, and thereafter, thermal oxidation is performed to form the insulating layer 3 on the isolation regions 4B. The mask is then removed and thermal oxidation is performed further to form the insulating layer 3, made of $SiO_2$, on the silicon light detection surface as well.

An N-type impurity is ion-implanted via the insulating layer 3 into an interior of the semiconductor substrate to form the N-type semiconductor layer 4A in a region directly below the insulating layer 3. The initial semiconductor substrate is the P-type semiconductor substrate 4C and thus a PN junction is formed between the semiconductor layer and the substrate. Next, the charge transfer electrodes 2, made of Al or other metal or polysilicon, are formed on the insulating layer 3 and the protective film 1, made of BPSG, is formed thereabove.

Then as shown in FIG. 4, the P-type impurity of high concentration is added to the back surface side of the semiconductor substrate 4 to form the accumulation layer 4D and then the antireflection film 5 is formed on the accumulation layer 4D. The antireflection layer 5 is formed of a dielectric multilayer film and is formed, for example, by laminating oxides of Si and Ge. Although the above-described back-illuminated solid-state image pickup device is completed by the above process, the actual structure is one in which adjacent charge transfer electrodes 2 overlap, and thus after the charge transfer electrodes 2 of a lower layer have been formed, an insulating layer, made of $SiO_2$ and serving as a spacer, is formed so as to be continuous to the initial insulating layer 3, and the charge transfer electrodes 2 of an upper layer are formed via the spacer. The steps in which these are formed differ and thus alignment precision is required of a mask for forming the lower-layer (odd-row) charge transfer electrodes 2 and a mask for forming the upper-layer (even-row) charge transfer electrodes 2.

Structures of the charge transfer electrodes shall now be described. First, a conventional electrode structure that serves as a comparative example shall be described.

Figure 5:
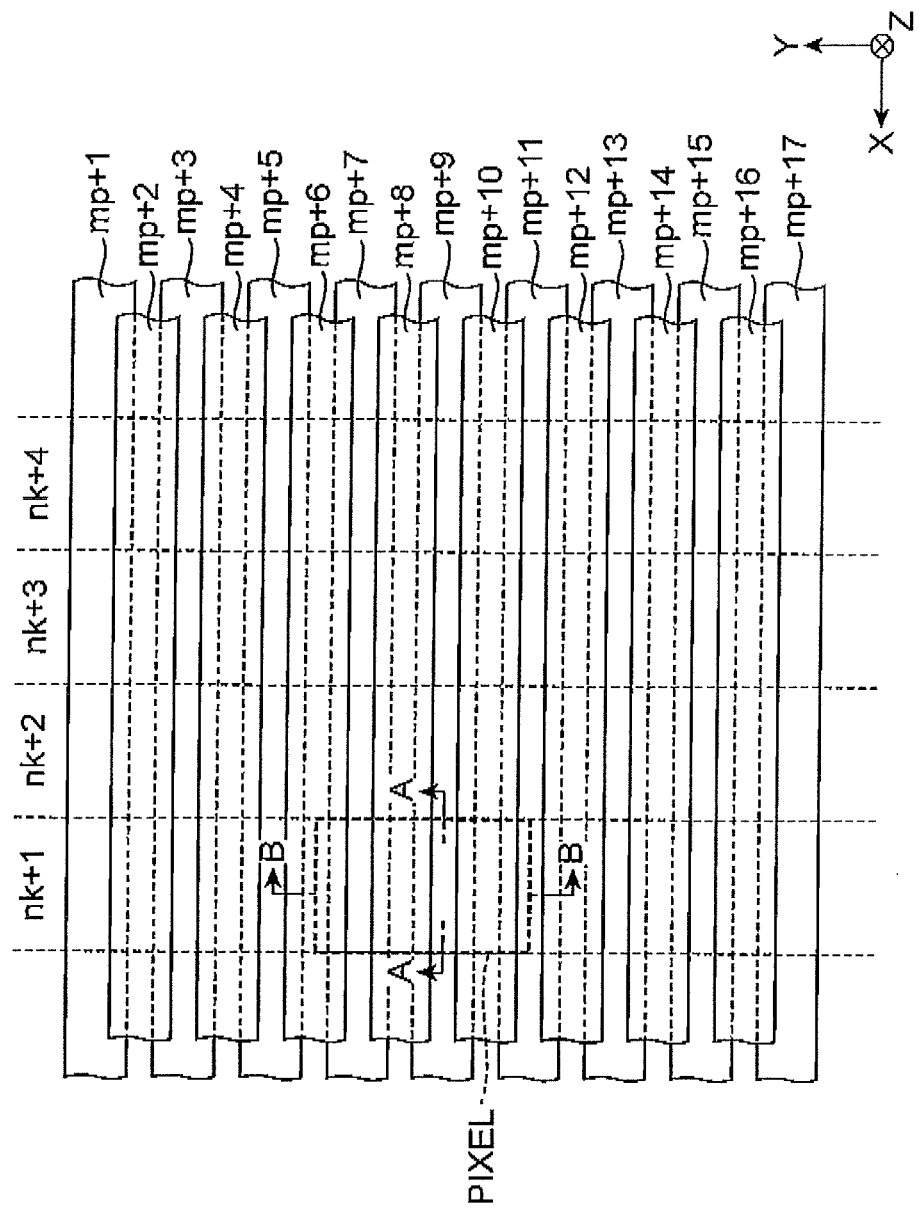
FIG. 5 is a plan view of an image pickup region for describing a structure of charge transfer electrodes 2 (mp+1 to mp+17 . . . ) of a comparative example.

FIG. 5 is a plan view of an image pickup region for describing a structure of the charge transfer electrodes 2 (mp+1 to mp+17 . . . ) of the comparative example and shows a plurality of charge transfer electrodes extending in the X-axis direction and CCD channels $n_N$ (nk+1 to nk+4) extending in the Y-axis direction (here, p and k are integers). A region surrounded by dotted lines PIXEL in the figure corresponds to being a single pixel. A sectional view taken along arrows A-A of this pixel is the same as that shown in FIG. 4.

Figure 6:
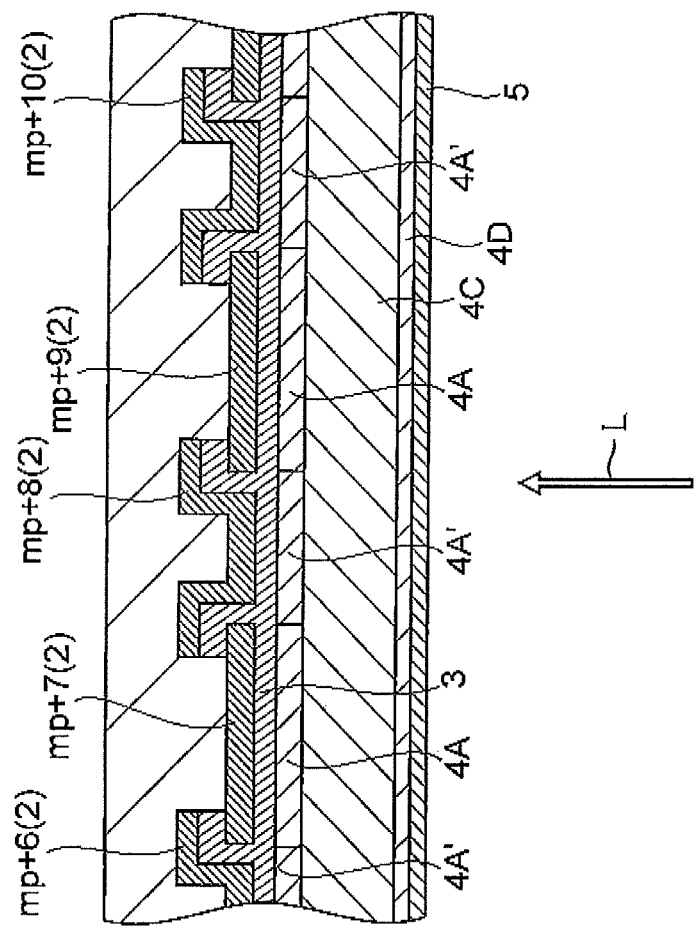
FIG. 6 is a sectional view taken along arrows B-B of a pixel shown in FIG. 5.

Also, a sectional view taken along arrows B-B of the pixel is shown in FIG. 6. Low-concentration N-type semiconductor regions 4A' are formed directly below the upper layer electrodes mp+6, mp+8, and mp+10. "Low concentration" means that the impurity concentration is lower than that of the N-type semiconductor regions 4A. The N-type semiconductor layers 4A and the low-concentration N-type semiconductor layers 4A' form a top layer of the P-type semiconductor substrate 4C, and each low-concentration N-type semiconductor layer 4A' is positioned between adjacent N-type semiconductor layers 4A. The low-concentration N-type semiconductor regions 4A' are formed to be lower in impurity concentration than the N-type semiconductor regions 4A. Methods for controlling the impurity concentration include a method of differing timings of formation and impurity addition amounts of the regions, a method of making the insulating layer 3 thick in thickness at the low concentration side and performing ion implantation via the insulating layer, etc.

The structure of the charge transfer electrodes according to the embodiment shall now be described. With this charge transfer electrode structure, a portion is notched and removed from the structure of the comparative example to arrange a so-called open gate structure.

FIG. 7 is a plan view of an image pickup region for describing the structure of the charge transfer electrodes 2 (mp+1 to mp+17 . . . ) of the embodiment and shows a plurality of charge transfer electrodes extending in the X-axis direction and CCD channels $n_N$ (k+1 to nk+4) extending in the Y-axis direction (here, p and k are integers). A region surrounded by dotted lines PIXEL in the figure corresponds to being a single pixel. A sectional view of the pixel taken along arrows A-A is the same as that shown in FIG. 4.

Figure 8:
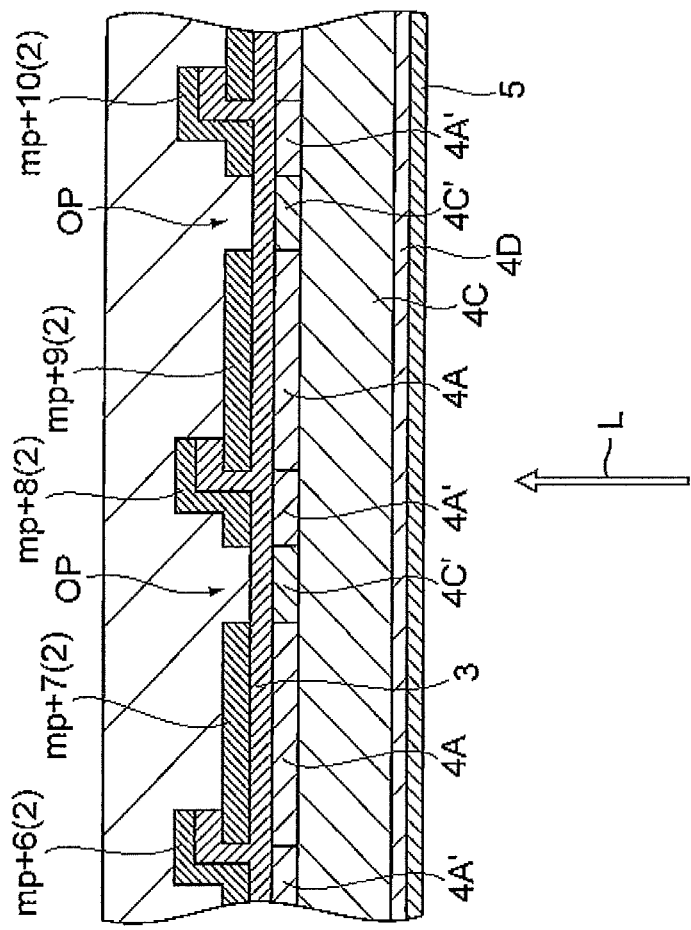
FIG. 8 is a sectional view taken along arrows B-B of a pixel shown in FIG. 7.

Also, a sectional view of the pixel taken along arrows B-B is shown in FIG. 8. Low-concentration N-type semiconductor regions 4A' are formed directly below the upper layer electrodes mp+6, mp+8, and mp+10. The low-concentration N-type semiconductor regions 4A' are formed to be lower in impurity concentration than the N-type semiconductor regions 4A. The methods for controlling the impurity concentration are the same as have been mentioned above.

Portions of the charge transfer electrodes 2 (mp+1 to mp+17 . . . ) that are adjacent along the charge transfer direction (Y-axis) overlap, and in forming these electrodes, after the lower layer charge transfer electrodes mp+7, mp+9, mp+11 . . . have been formed, the upper layer charge transfer electrodes mp+6, mp+8, mp+10 . . . are formed via the insulating layer 3 that serves as a spacer.

Here, as shown in FIG. 7, a plurality of openings OP for transmitting light are formed between the charge transfer electrodes 2 (mp+1 to mp+17 . . . ) that are adjacent to each other along the Y-axis direction. The structure of the charge transfer electrodes shall now be described in detail. Sides that are not mentioned in the following description are straight lines that are parallel to the X-axis. One side of the charge transfer electrode mp+7 has notched portions that are periodically depressed trapezoidally toward the Y-axis positive direction, one side of the adjacent charge transfer electrode mp+8 has notched portions that are periodically depressed trapezoidally toward the Y-axis negative direction, and the openings OP are defined by the notched portions of the two electrodes opposing each other.

The openings OP are formed in the same relationship between the notched portions of the charge transfer electrode mp+9 and the charge transfer electrode mp+10 that are adjacent to each other. The four charge transfer electrodes mp+7 to mp+10 are included in the same pixel PIXEL. As shown in FIG. 8, a high-concentration P-type semiconductor region 4C' is formed in a region directly below each opening OP. Thus, in these regions, a PN junction is not formed and carriers are not accumulated.

Although the light L that is made incident on the back surface is detected at the light detection surface side, in the solid-state image pickup device of the present embodiment, a portion of the light to be subject to light detection is transmitted to an exterior via the openings OP. There are no charge transfer electrodes at the openings OP and thus reflection of the incident light is suppressed and interference of the incident light and the reflected light is suppressed. Image degradation due to etaloning is thus suppressed and image quality is improved.

Also, as shown in FIG. 7, the plurality of openings OP are positioned so as to be aligned along the charge transfer direction (Y-axis direction). In a case where the openings OP formed between adjacent charge transfer electrodes are aligned in this manner, arrangement thereof is simple. However, with this structure, alignment precision is required during manufacture of the charge transfer electrodes of the upper and lower layers, and there is thus room for further improvement in that in a case where the alignment precision is low, areas of the openings OP at the pixels differ according to each column and characteristics vary according to pixel, etc. There is also a problem that slight, fixed noise patterns occur in etaloning characteristics, dark characteristics, etc. An embodiment with which the layout of the openings OP is improved further shall thus be described next.

Figure 9:
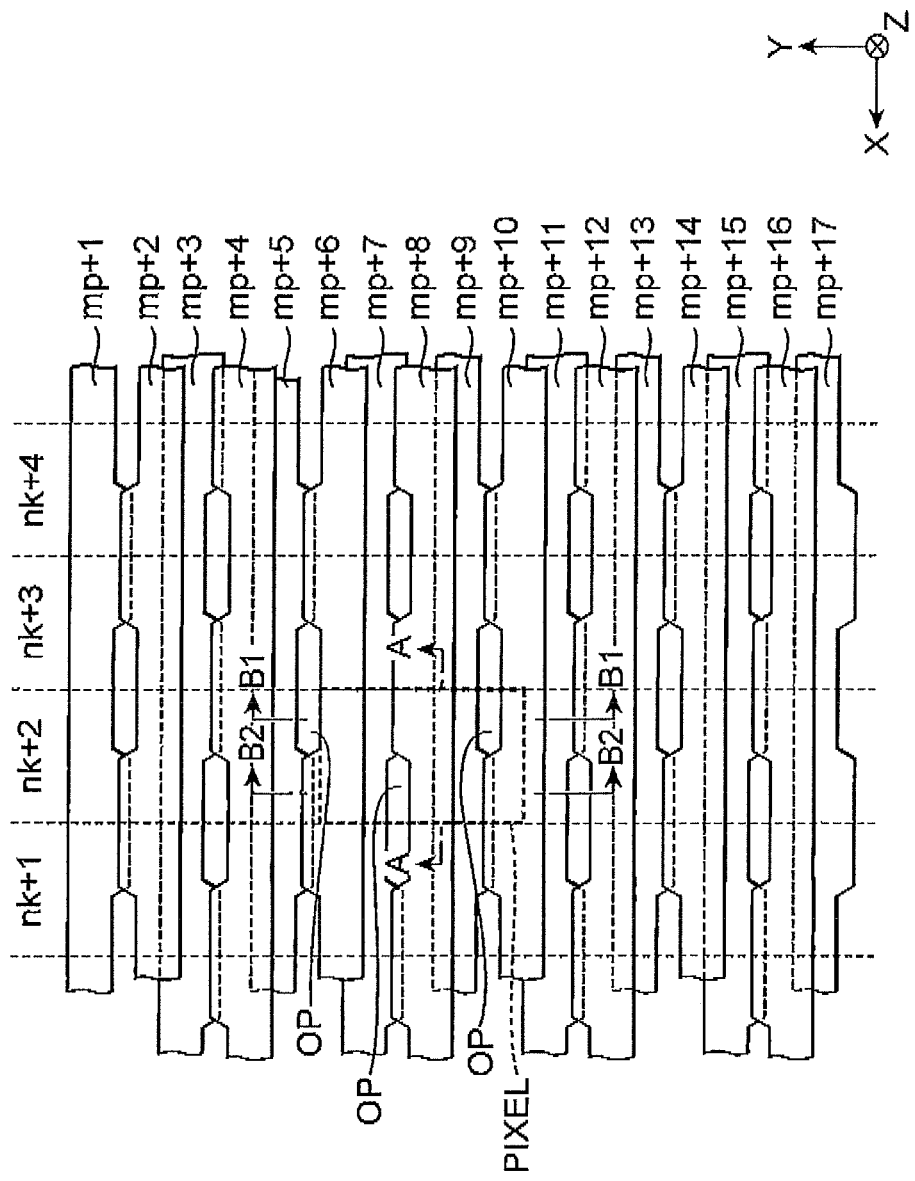
FIG. 9 is a plan view of an image pickup region for describing a structure of charge transfer electrodes 2 (mp+1 to mp+17 . . . ) of an embodiment.

FIG. 9 is a plan view of an image pickup region for describing the structure of the charge transfer electrodes 2 (mp+1 to mp+17 . . . ) of the embodiment and shows a plurality of charge transfer electrodes extending in the X-axis direction and CO) channels $n_N$ (nk+1 to nk+4) extending in the Y-axis direction (here, p and k are integers). A region surrounded by dotted lines PIXEL in the figure corresponds to being a single pixel. A sectional view of this pixel taken along arrows A-A is the same as that shown in FIG. 4.

Figure 10:
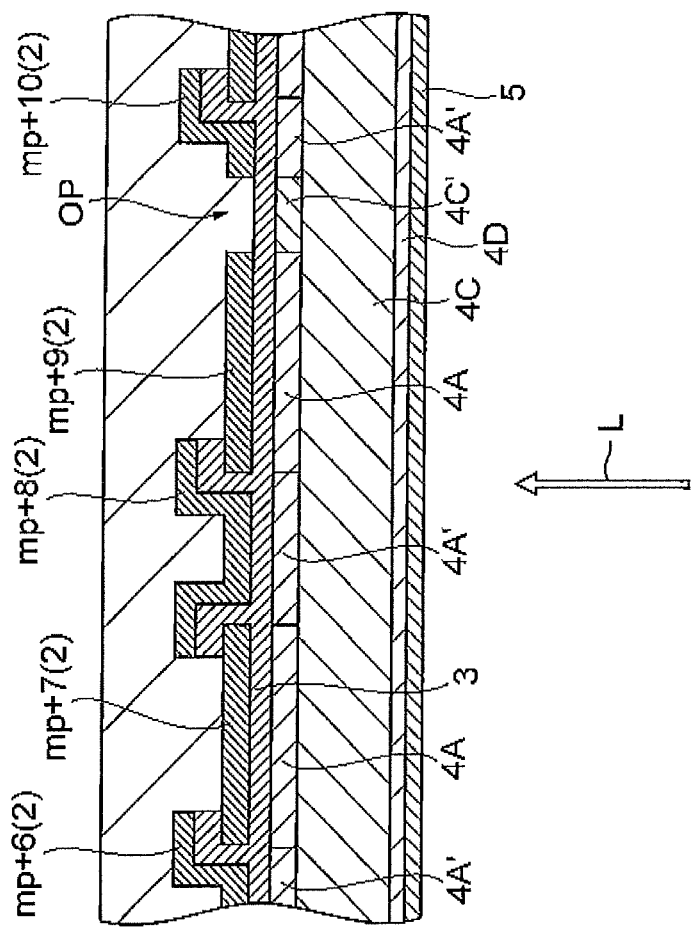
FIG. 10 is a sectional view taken along arrows B1-B1 of a pixel shown in FIG. 9.
Figure 11:
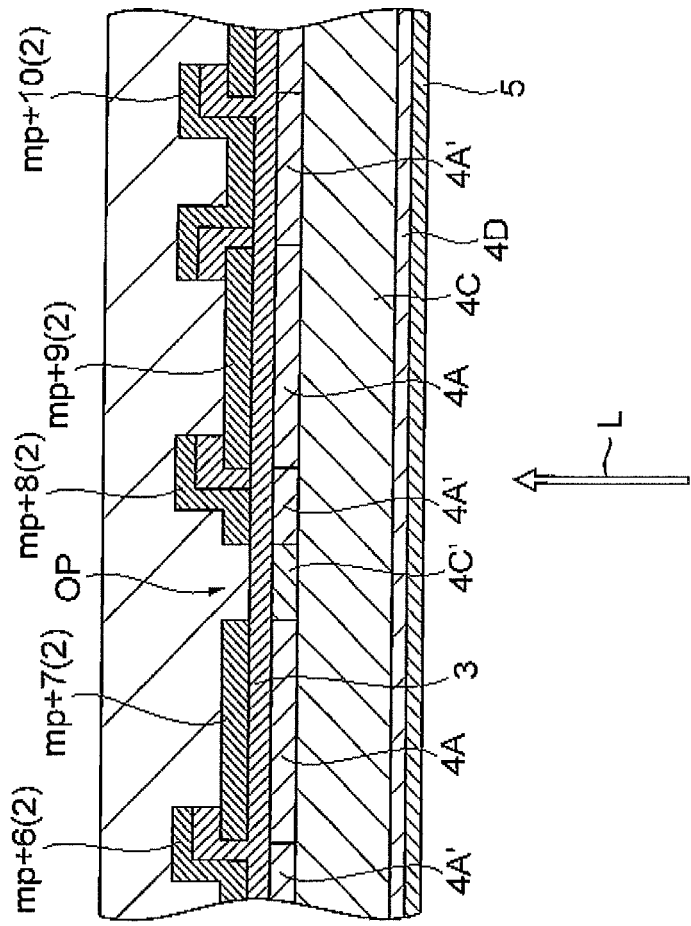
FIG. 11 is a sectional view taken along arrows B2-B2 of the pixel shown in FIG. 9.

Also, a sectional view of the pixel taken along arrows B1-B1 is shown in FIG. 10, and a sectional view taken along arrows B2-B2 is shown in FIG. 11. Low-concentration N-type semiconductor regions 4A' are formed directly below the upper layer electrodes mp+6, mp+8, and mp+10. The low-concentration N-type semiconductor regions 4A' are formed to be lower in impurity concentration than the N-type semiconductor regions 4A. The methods for controlling the impurity concentration are the same as have been mentioned above.

Portions of the charge transfer electrodes 2 (mp+1 to mp+17 . . . ) that are adjacent along the charge transfer direction (Y-axis) overlap, and in forming these electrodes, after the lower layer charge transfer electrodes mp+7, mp+9, mp+11 . . . have been formed, the upper layer charge transfer electrodes mp+6, mp+8, mp+10 . . . are formed via the insulating layer 3 that serves as a spacer.

As in the structure shown in FIG. 7, a plurality of openings OP for transmitting light are formed between the charge transfer electrodes 2 (mp+1 to mp+17 . . . ) that are adjacent to each other along the Y-axis direction in the structure in FIG. 9 as well. One side of the charge transfer electrode mp+7 has notched portions that are periodically depressed trapezoidally toward the Y-axis positive direction, one side of the adjacent charge transfer electrode mp+8 has notched portions that are periodically depressed trapezoidally toward the Y-axis negative direction, and the openings OP are defined by the notched portions of the two electrodes opposing each other. The periods along the X-axis direction of the positions at which the notched portions are formed are the same.

The openings OP are formed in the same relationship between the notched portions of the charge transfer electrode mp+9 and the charge transfer electrode mp+10 that are adjacent to each other. Although the periods along the X-axis direction of the positions at which these notched portions are formed are the same, the periods are in a relationship in which the phase of the formation positions along the X-axis direction is inverted with respect to the formation positions of the notched portions of the charge transfer electrodes mp+7 and mp+8. The four charge transfer electrodes mp+7 to mp+10 are included in the same pixel PIXEL. As shown in FIG. 10, the high-concentration P-type semiconductor region 4C' is formed in a region directly below each opening OP. Thus, in these regions, a PN junction is not formed and carriers are not accumulated.

Here, as shown in FIG. 9, the openings OP are positioned staggeredly along the charge transfer direction (Y-axis direction). That is, the openings OP are positioned in a mutually staggered manner. As mentioned above, the charge transfer electrodes of the odd rows that are positioned at the lower layer (mp+1, mp+3, mp+5, mp+7 . . . ) are formed at the same time, and the charge transfer electrodes of the even rows that are positioned at the upper layer (mp+2, mp+4, mp+6, mp+8 . . . ) are formed at the same time after the forming of the lower layer electrodes. Thus, in a case of employing the staggered opening layout such as that of the present embodiment, if the charge transfer electrodes of the even rows are shifted in a lateral direction during manufacture, for example, so that the areas of the openings OP between the charge transfer electrode mp+7 and the charge transfer electrode mp+8 increase, the areas of the openings OP between the charge transfer electrode mp+9 and the charge transfer electrode mp+10 decrease. That is, this structure has merits of being high in alignment precision tolerance and transmitted light amount being equalized and characteristics being made uniform for each pixel, and occurrence of fixed noise patterns is also suppressed.

An embodiment with which the structure of the charge transfer electrode is modified further shall now be described.

Figure 12:
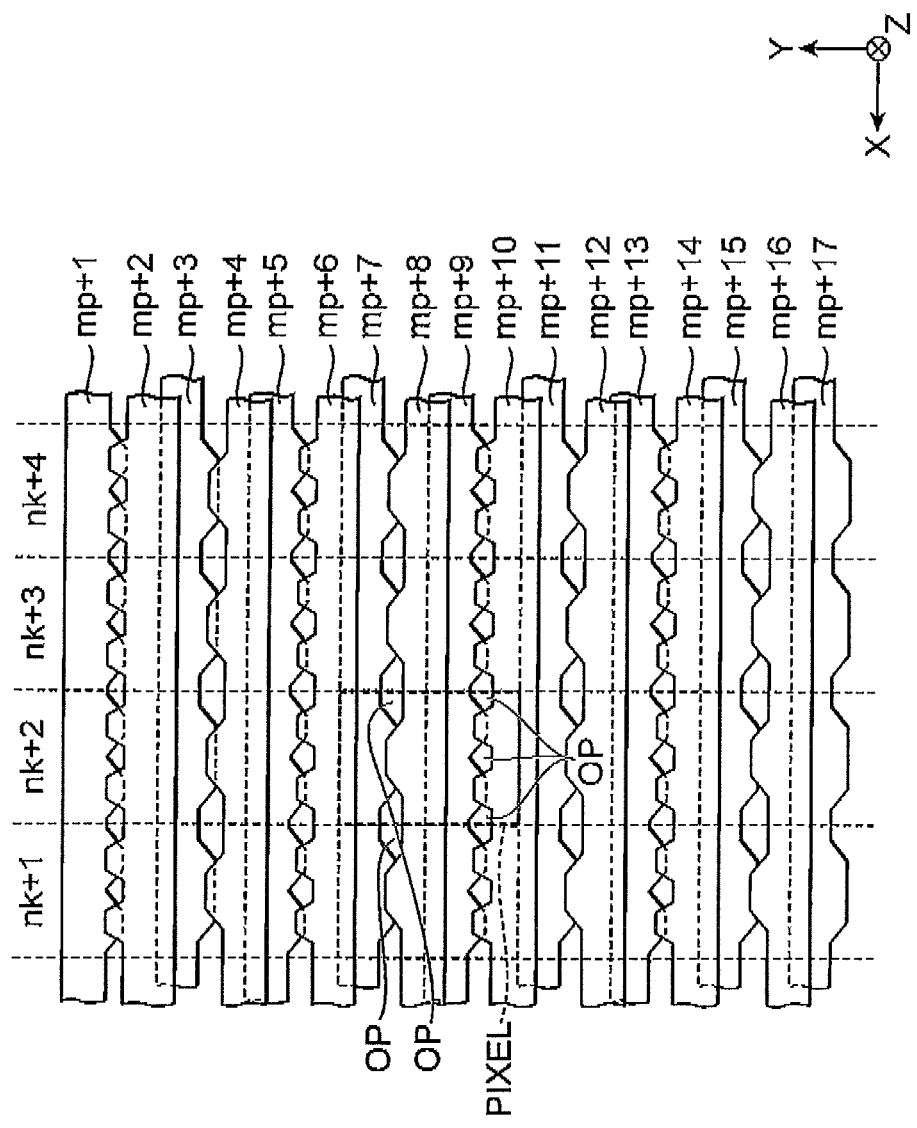
FIG. 12 is a plan view of an image pickup region for describing a structure of charge transfer electrodes 2 (mp+1 to mp+17 . . . ) of an embodiment.

FIG. 12 is a plan view of an image pickup region for describing a structure of charge transfer electrodes 2 (mp+1 to mp+17 . . . ) of the embodiment and shows a plurality of charge transfer electrodes extending in the X-axis direction and CCD channels $n_N$ (nk+1 to nk+4) extending in the Y-axis direction (here, p and k are integers). A region surrounded by dotted lines PIXEL in the figure corresponds to being a single pixel. The points of difference with respect to the above-described embodiment are just the shapes and the layout of the charge transfer electrodes 2 (mp+1 to mp+17 . . . ). Other arrangements are the same as those of the above-described embodiment except for the P-type impurity being added to form the P-type semiconductor region 4C' directly below each opening OP as shown in FIG. 8, FIG. 10, or FIG. 11. Also, the sectional structure of a pixel as sectioned along a plane that is vertical to the charge transfer direction (Y-axis) and does not pass through an opening is the same as that shown in FIG. 4.

The charge transfer electrode mp+7 has a first shape, the charge transfer electrode mp+8 has a second shape, the charge transfer electrode mp+9 has a third shape, and the charge transfer electrode p+4 has a fourth shape. The first to fourth shapes all differ from each other and the four shapes are repeated according to pixel along the charge transfer direction.

One side of the first shape, which the charge transfer electrode mp+7 has, has notched portions that are periodically depressed trapezoidally toward the Y-axis positive direction.

One side of the second shape, which the charge transfer electrode mp+8 has, has notched portions that are periodically depressed trapezoidally toward the Y-axis negative direction, the period of the notched portions is the same as that of the charge transfer electrode mp+7, and a length of an innermost side of each notched portion differs from that of the charge transfer electrode mp+7. The notched portions of the charge transfer electrode mp+7 and the charge transfer electrode mp+8 oppose each other to form openings OP of a first pattern.

One side of the third shape, which the charge transfer electrode mp+9 has, has notched portions that are periodically depressed trapezoidally or triangularly toward the Y-axis positive direction. In the charge transfer electrode mp+9, a number of notched portions per unit length in the X-axis direction is greater than the number of notched portions of each of the charge transfer electrodes mp+7 and mp+8. The trapezoidal notched portions and the triangular notched portions are formed alternately along the X-axis.

One side of the fourth shape, which the charge transfer electrode mp+10 has, has notched portions that are periodically depressed trapezoidally toward the Y-axis negative direction, the period of the notched portions is the same as that of the charge transfer electrode mp+9, and the length of an innermost side of each notched portion is longer than the length of the innermost side of each trapezoidal notched portion in the charge transfer electrode mp+9. The notched portions of the charge transfer electrode mp+9 and the charge transfer electrode mp+10 oppose each other to form openings OP of a second pattern. Also, the first pattern and the second pattern of the openings OP differ from each other.

In the case of such a structure, the openings OP are high in randomness because the shapes of the charge transfer electrodes and the patterns of the openings differ and, for example, even in a case where the charge transfer electrode mp+8 and mp+10 are shifted in the lateral direction, variation of the opening area can be suppressed.

The general shapes of the charge transfer electrodes may be expressed as the charge transfer electrode of a p+1-th row having the first shape, the charge transfer electrode of a p+2-th row having a second shape, the charge transfer electrode of a p+3-th row having a third shape, and the charge transfer electrode of a p+4-th row having a fourth shape, where p is an integer no less than 0.

Figure 13:
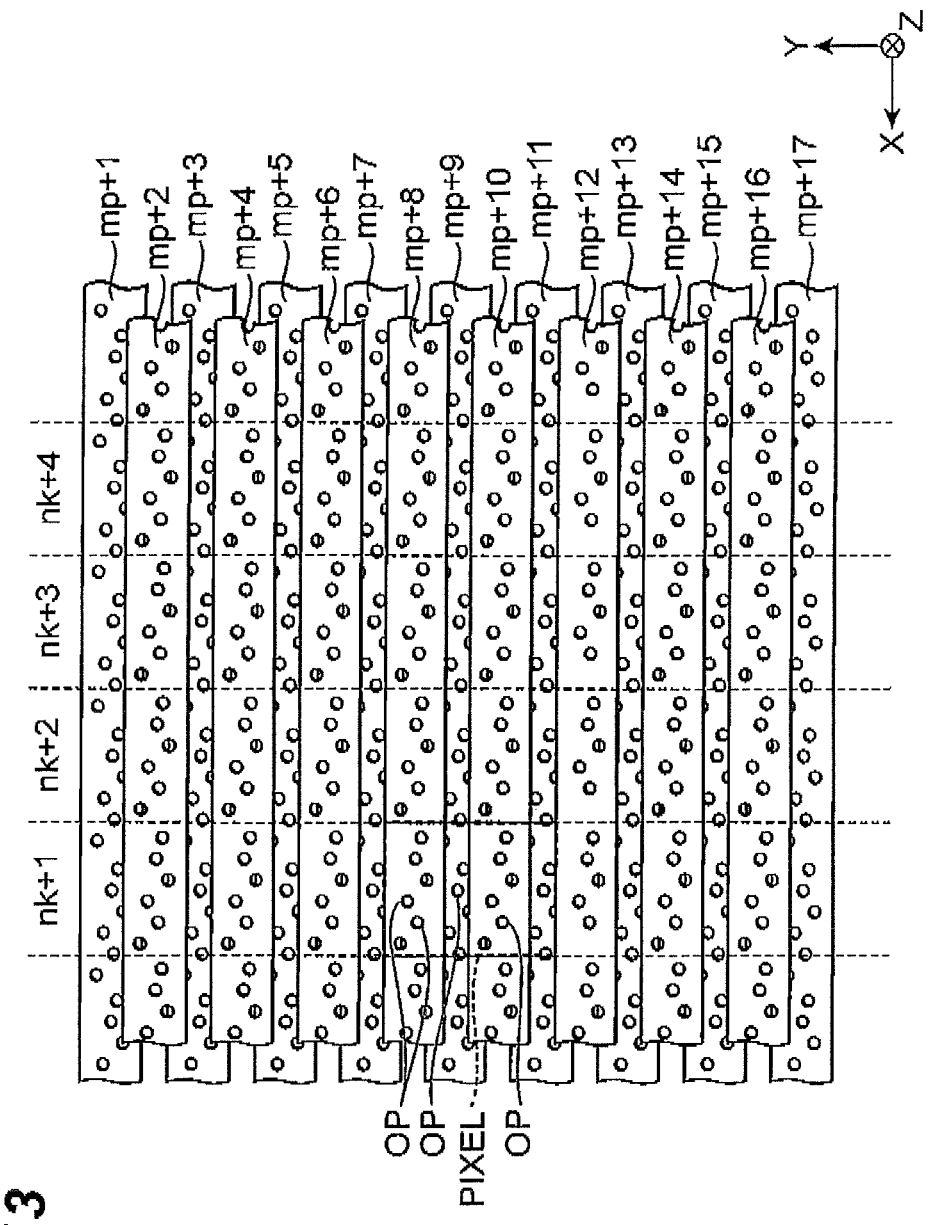
FIG. 13 is a plan view of an image pickup region for describing a structure of charge transfer electrodes 2 (mp+1 to mp+17 . . . ) of an embodiment.

FIG. 13 is a plan view of an image pickup region for describing a structure of charge transfer electrodes 2 (mp+1 to mp+17 . . . ) of another embodiment and shows a plurality of charge transfer electrodes extending in the X-axis direction and CCD channels $n_N$ (nk+1 to nk+4) extending in the Y-axis direction (here, p and k are integers). A region surrounded by dotted lines PIXEL in the figure corresponds to being a single pixel. The points of difference with respect to the above-described comparative example are that each of the charge transfer electrodes 2 (mp+1 to mp+17 . . . ) that extend rectilinearly along the X-axis has a plurality of openings OP, and directly below each opening OP, a P-type impurity is added to form a P-type semiconductor region 4C' as shown in FIG. 8, FIG. 10, or FIG. 11. The other arrangements are the same as those of the comparative example. Also, the sectional structure of a pixel as sectioned along a plane that is vertical to the charge transfer direction (Y-axis) and does not pass through an opening is the same as that shown in FIG. 4. The numbers and layouts of the openings OP in the respective pixels are the same as each other.

In the solid-state image pickup device of the present embodiment, the plurality of openings OP for transmitting light are formed inside the respective charge transfer electrodes 2 (mp+1 to mp+17 . . . ), and a portion of the light to be subject to light detection is transmitted to the exterior via the openings OP. There are no charge transfer electrodes at the openings OP and thus reflection of the incident light is suppressed and interference of the incident light and the reflected light is suppressed. Image degradation due to etaloning is thus suppressed and image quality is improved.

The present invention is not limited to the embodiments described above, and for example, a compound semiconductor, such as GaAs, GaN, etc., may be used as the semiconductor material.

REFERENCE SIGNS LIST

100: back-illuminated solid-state image pickup device, L: incident light, 1: protective film, 2: charge transfer electrode, 3: insulating layer, 4: semiconductor substrate, 5: antireflection film, 4A: N-type semiconductor layer, 4B: isolation region, 4C: P-type semiconductor substrate, 4D: accumulation layer.

The invention claimed is:

1. A back-illuminated solid-state image pickup device comprising:
   a semiconductor substrate having a light incident surface at a back surface side; and
   a plurality of charge transfer electrodes disposed at a light detection surface at an opposite side of the semiconductor substrate with respect to the light incident surface, wherein
   a plurality of openings for transmitting light are formed between charge transfer electrodes that are adjacent to each other,
   wherein the openings are positioned staggeredly along the charge transfer direction.

2. A back-illuminated solid-state image pickup device comprising:
   a semiconductor substrate having a light incident surface at a back surface side; and
   a plurality of charge transfer electrodes disposed at a light detection surface at an opposite side of the semiconductor substrate with respect to the light incident surface, wherein
   a plurality of openings for transmitting light are formed between charge transfer electrodes that are adjacent to each other,
   wherein
   p is an integer no less than 0,
   the charge transfer electrode of a p+1-th row has a first shape,
   the charge transfer electrode of a p+2-th row has a second shape,
   the charge transfer electrode of a p+3-th row has a third shape,
   the charge transfer electrode of a p+4-th row has a fourth shape,
   the first to fourth shapes all differ from each other,
   openings of a first pattern are formed between the charge transfer electrodes of the p+1-th row and the p+2-th row,
   openings of a second pattern are formed between the charge transfer electrodes of the p+3-th row and the p+4-th row, and
   the first and second patterns are mutually different.

3. A back-illuminated solid-state image pickup device comprising:
   a semiconductor substrate having a light incident surface at a back surface side; and
   a plurality of charge transfer electrodes disposed at a light detection surface at an opposite side of the semiconductor substrate with respect to the light incident surface, wherein
   a plurality of openings for transmitting light are formed inside the respective charge transfer electrodes.

* * * * *

UNITED STATES PATENT AND TRADEMARK OFFICE
CERTIFICATE OF CORRECTION

PATENT NO. : 8,624,301 B2  Page 1 of 1
APPLICATION NO. : 13/258696
DATED : January 7, 2014
INVENTOR(S) : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 61 days.

Signed and Sealed this
Twenty-second Day of September, 2015

Michelle K. Lee
*Director of the United States Patent and Trademark Office*